(12) United States Patent
Fleurov et al.

(10) Patent No.: US 6,466,602 B1
(45) Date of Patent: Oct. 15, 2002

(54) GAS DISCHARGE LASER LONG LIFE ELECTRODES

(75) Inventors: Vladimir B. Fleurov; Michael C. Cates, both of Escondido; Michael Du'Lyea, Lakeside; Igor V. Fomenkov, San Diego; Dmitri V. Gaidarenko, Poway; Jean-Marc Hueber, La Jolla; Richard G. Morton; Eckehard D. Onkels, both of San Diego; Robert A. Shannon, Ramona; Ross H. Winnick, San Diego, all of CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/590,961

(22) Filed: Jun. 9, 2000

(51) Int. Cl.$^7$ ................................................ H01S 3/097
(52) U.S. Cl. ............................ 372/87; 372/57; 372/59
(58) Field of Search ............................... 372/55, 57, 58, 372/59, 87, 38.1

(56) References Cited

U.S. PATENT DOCUMENTS

| | | | |
|---|---|---|---|
| 4,414,488 A | 11/1983 | Hoffmann et al. | 315/39 |
| 4,546,482 A | 10/1985 | Bagaglia et al. | 372/86 |
| 4,686,682 A | 8/1987 | Haruta et al. | 372/87 |
| 4,703,490 A | 10/1987 | Brumme et al. | 372/86 |
| 4,774,714 A | 9/1988 | Javan | 372/109 |
| 4,860,300 A * | 8/1989 | Baumler et al. | 372/57 |
| 4,876,693 A | 10/1989 | Lucero et al. | 372/82 |
| 4,959,840 A | 9/1990 | Akins et al. | 372/57 |
| 5,048,041 A * | 9/1991 | Akins et al. | 372/57 |
| 5,070,513 A | 12/1991 | Letardi | 372/83 |
| 5,187,716 A * | 2/1993 | Haruta et al. | 372/57 |
| 5,247,534 A * | 9/1993 | Muller-Horsche | 372/58 |
| 5,535,233 A | 7/1996 | Mizoguchi et al. | 372/87 |
| 5,557,629 A | 9/1996 | Mizoguchi et al. | 372/87 |
| 5,646,954 A * | 7/1997 | Das et al. | 372/25 |
| 5,771,258 A | 6/1998 | Morton et al. | 372/57 |
| 5,875,207 A * | 2/1999 | Osmanow | 372/86 |
| 5,940,421 A * | 8/1999 | Partlo et al. | 372/38 |
| 6,208,675 B1 * | 3/2001 | Webb | 372/58 |

FOREIGN PATENT DOCUMENTS

JP 2631607 7/1997 ............... 3/38

* cited by examiner

Primary Examiner—Paul Ip
Assistant Examiner—Davienne Monbleau
(74) Attorney, Agent, or Firm—John R. Ross

(57) ABSTRACT

A gas discharge laser having a laser chamber with two elongated erodable electrode elements, each having an erodable section and an electrode with support configured to minimize discharge region laser gas turbulence and with the electrode elements being configured to permit gradual erosion over more than 8 billion pulses without causing substantial changes in the shape of electrical discharges between the electrode elements. A pulse power system provides electrical pulses of at least 2J at rates of at least 2 KHz. A blower circulates laser gas between the electrodes at speeds of at least 2 m/s and a heat exchanger is provided to remove heat produced by the blower and the discharges.

31 Claims, 15 Drawing Sheets

GAS DISCHARGE LASER LONG LIFE ELECTRODES

This invention relates to electric discharge lasers and in particular to such lasers having chambers with long life electrodes.

BACKGROUND OF THE INVENTION

The principal components of a prior art KrF excimer laser chambers are shown in FIG. 1. This chamber is a part of a laser system used as a light source for integrated circuit lithography. These components include a chamber housing 2. The housing contains two electrodes 84 and 83 each about 50 cm long and spaced apart by about 20 mm, a blower 4 for circulating a laser gas between the electrodes at velocities fast enough to clear (from a discharge region between the two electrodes) debris from one pulse prior to the next succeeding pulse at a pulse repetition rate in the range of 1000 Hz or greater, and a water cooled finned heat exchanger 6 for removing heat added to the laser gas by the fan and by electric discharges between the electrodes. The chamber may also include baffles and vanes for improving the aerodynamic geometry of the chamber. The laser gas is comprised of a mixture of about 0.1 percent fluorine, about 1.0 percent krypton and the rest neon. Each pulse is produced by applying a very high voltage potential across the electrodes with a pulse power supply 8 which causes a discharge between the electrodes lasting about 30 nanoseconds to produce a gain region about 20 mm high, 3 mm wide and 700 mm long. The discharge deposits about 2.5 J of energy into the gain region. As shown in FIG. 2, lasing is produced in a resonant cavity, defined by an output coupler 2A and a grating based line narrowing unit (called a line narrowing package or LNP, shown disproportionately large) 2B comprising a three prism beam expander, a tuning mirror and a grating disposed in a Littrow configuration. The energy of the output pulse 3 in this prior art KrF lithography laser is typically about 10 mJ.

There are many industrial applications of electric discharge lasers. One important use is as the light source for integrated circuit lithography machines. One such laser light source is the line narrowed KrF laser described above which produces a narrow band pulsed ultraviolet light beam at about 248 nm. These lasers typically operate in bursts of pulses at pulse rates of about 1000 to 4000 Hz. Each burst consists of a number of pulses, for example, about 80 pulses, one burst illuminating a single die section on a wafer with the bursts separated by down times of a fraction of a second while the lithography machine shifts the illumination between die sections. There is another down time of a few seconds when a new wafer is loaded. Therefore, in production, for example, a 2000 Hz, KrF excimer laser may operate at a duty factor of about 30 percent. The operation is 24 hours per day, seven days per week, 52 weeks per year. A laser operating at 2000 Hz "around the clock" at a 30 percent duty factor will accumulate more than 1.5 billion pulses per month. Any disruption of production can be extremely expensive. For these reasons, prior art excimer lasers designed for the lithography industry are modular so that maintenance down time is minimized.

Maintaining high quality of the laser beam produced by these lasers is very important because the lithography systems in which these laser light sources are used are currently required to produce integrated circuits with features smaller than 0.25 microns and feature sizes get smaller each year. Laser beam specifications limit the variation in individual pulse energy, the variation of the integrated energy of series of pulses, the variation of the laser wavelength and the magnitude of the bandwidth of the laser beam.

Typical operation of electric discharge lasers such as that depicted in FIG. 1 causes electrode erosion. Erosion of these electrodes affects the shape of the discharge which in turn affects the quality of the output beam as well as the laser efficiency. Electrode designs have been proposed which are intended to minimize the effects of erosion by providing on the electrode a protruding part having the same width as the discharge. Some examples are described in Japanese Patent No. 2631607. These designs, however, produce adverse effects on gas flow. In these gas discharge lasers, it is very important that virtually all effects of each pulse be blown out of the discharge region prior to the next pulse.

What is needed is a gas discharge laser having erodable electrodes which do not adversely affect gas flow and can withstand many billions of pulses without adversely affecting laser beam quality.

SUMMARY OF THE INVENTION

The present invention provides a gas discharge laser having a laser chamber with two elongated erodable electrode elements, each having an erodable section and an electrode support configured to minimize discharge region laser gas turbulence and with the electrode elements being configured to permit gradual erosion over more than 8 billion pulses without causing substantial changes in the shape of electrical discharges between the electrode elements. A pulse power system provides electrical pulses of at least 2 J at rates of at least 1 KHz. A blower circulates laser gas between the electrodes at speeds of at least 10 m/s and a heat exchanger is provided to remove heat produced by the blower and the discharges.

DETAILED DESCRIPTION OF PREFERRED EMBODIMENTS

Pulse Power Supply System

Figure 3:
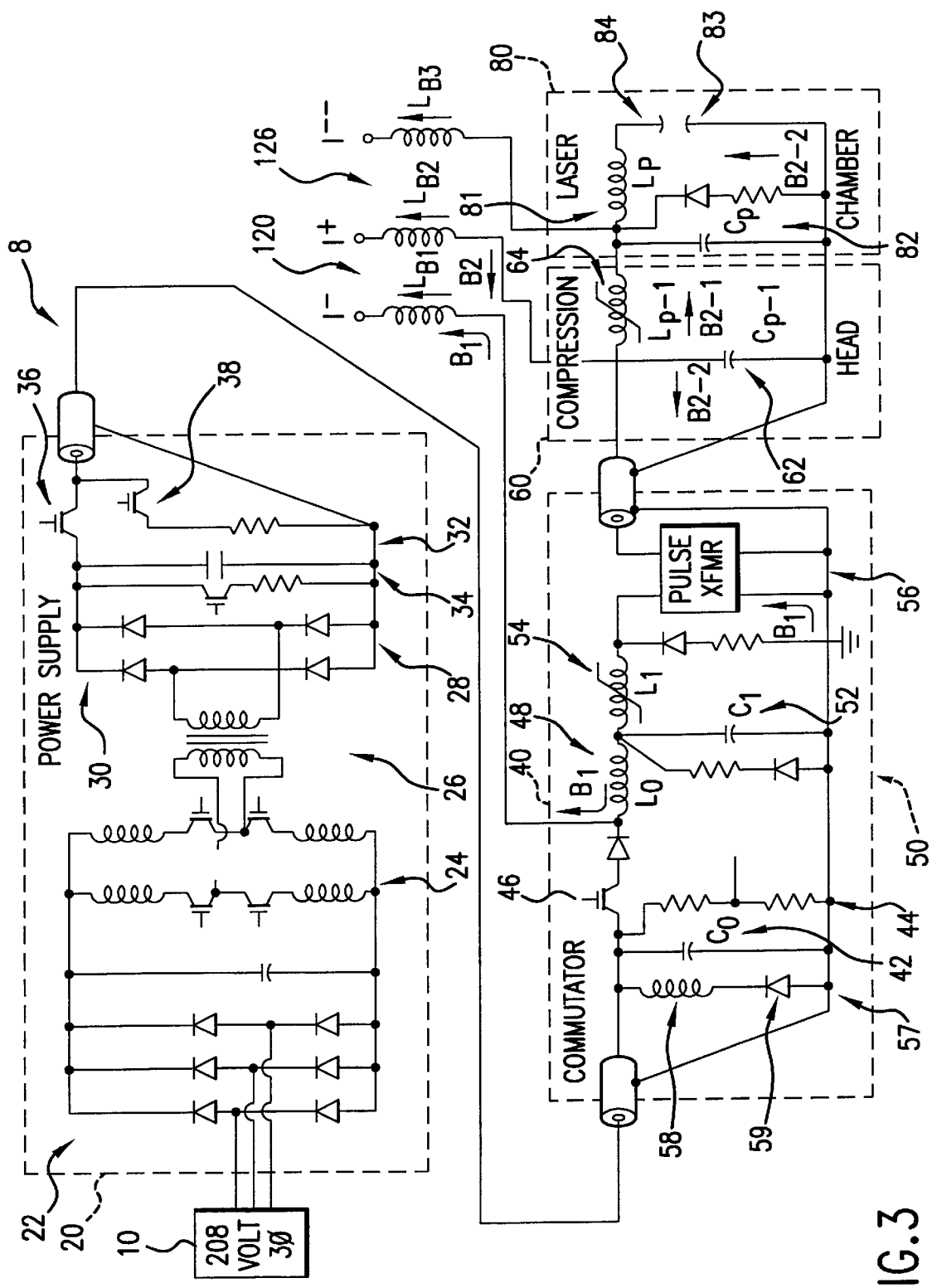
FIG. 3 shows the principal features of a pulse power system of a prior-art gas discharge laser.

The principal components of an electrical circuit 8 for providing pulse power to produce electrical discharges in a gas discharge laser are shown in FIG. 3. The pulse power system operates from a standard 208-volt, 3 phase electrical source. A power supply using rectifier 22, inverter 24, transformer 26 and rectifier 30 charges 8.1 micro-Farad charging capacitor $C_0$ 42 to a voltage level between about 500 to 1200 volts as directed by a laser control processor (not shown). The laser control processor directs the closing of an IGBT switch 46 when a pulse is desired which causes the energy on $C_0$ to be discharged into the follow-on portions of the pulse power system. The charge on $C_0$ is transferred successively to capacitor bank $C_1$ 52 through inductor 48 then through saturable inductor 54 and through voltage transformer 56 to capacitor bank $C_{p-1}$ 62 and then through saturable inductor 64 to peaking capacitor bank $C_p$ 82. As shown in FIG. 3, peaking capacitor bank $C_p$ is connected electrically in parallel with electrodes 84 and 83.

Figure 4A:
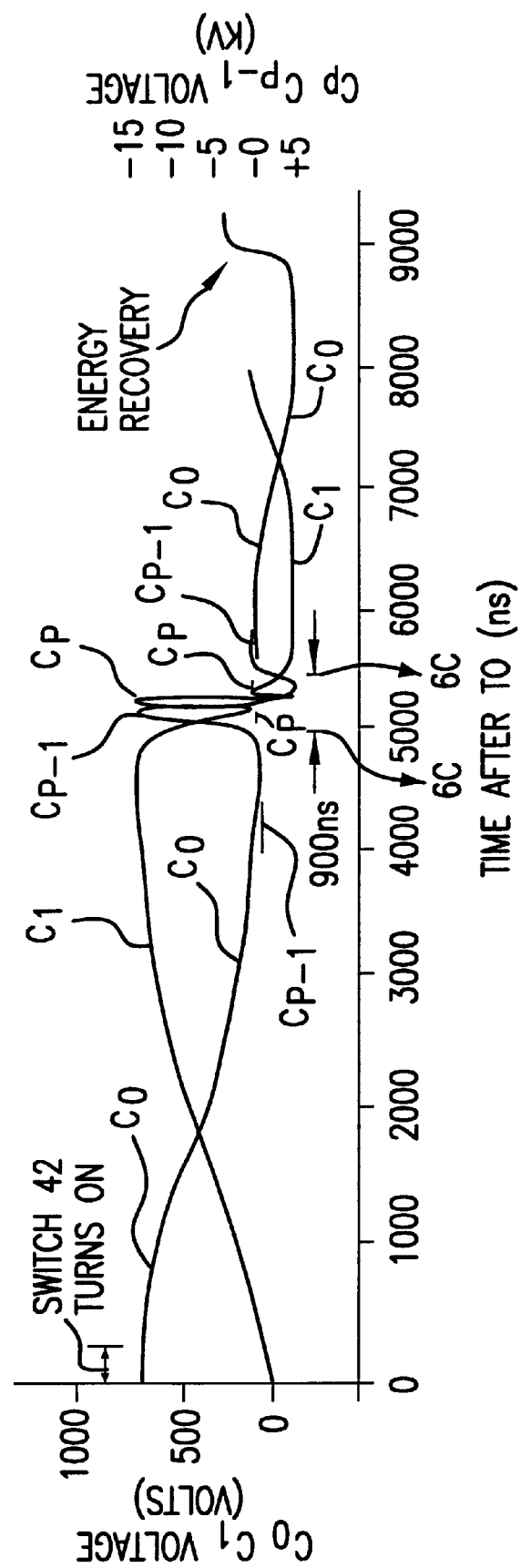
FIGS. 4A and 4B show electrical pulse shapes on the FIG. 3 pulse power system.
Figure 4B:
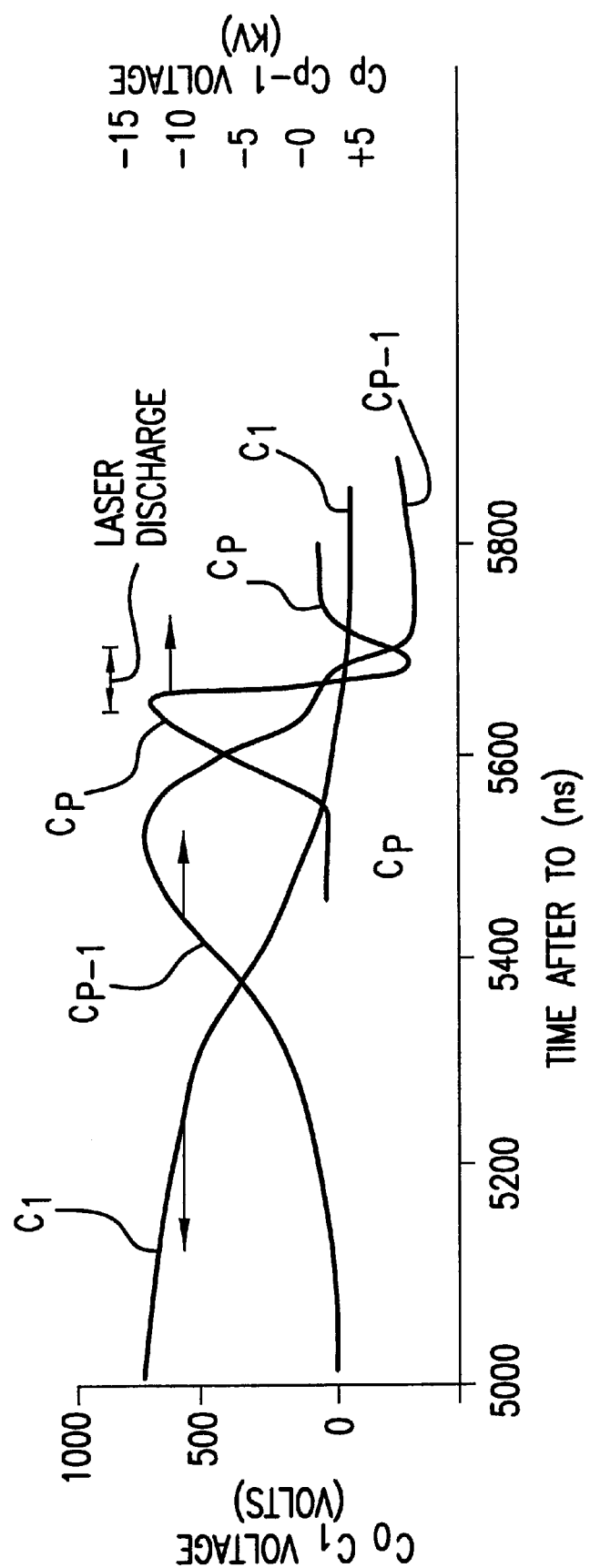

FIG. 4A shows the potential on capacitor banks $C_0$, $C_1$, $C_{p-1}$ and $C_p$ as a function of time beginning with the closing of switch 42 and for the following 9 microseconds. FIG. 4B shows an 800 ns time slice just before and after the discharge. The reader should note that the peaking capacitor bank $C_p$ is charged to approximately −15,000 V just prior to the discharge. The discharge lasts about 30 ns. During the discharge, the electron flow is first from the upper electrode, cathode 84 to the lower grounded electrode, anode 83. A current "overshoot" charges $C_p$ to a positive value of about +6,000 V at which time the downward flow of electrons is reversed after which the electron flow is from the lower grounded electrode to the upper electrode during the last approximately 15 ns of the discharge, all as shown in FIG. 4B.

Erosion

Applicants have discovered that electrode erosion occurs on both electrodes but that the erosion rate of the grounded electrode (anode 83) is about four times that of the high voltage electrode (cathode 84). Also, operation normally results in an insulating layer of metal fluorides being built up very gradually on portions of the anode. In some cases near the end of life of the electrodes, the portion of the discharge surface covered by the layer can be between 50% and 80% or more. In the regions covered by the fluoride layer discharge current flows through tiny holes which typically tend to have approximately circular cross sections with diameters of about 50 to 100 microns. The surfaces covered by the fluoride layer do not suffer substantial further erosion but the erosion rate is increased on the non-covered discharge surfaces as the non-covered surface area decreases. (There appears to be some erosion on the covered surfaces at the locations of the tiny holes.) Electrode erosion and fluoride build up in prior art lasers typically becomes so severe that at about 5 to 10 billion pulses, the laser beam no longer meets quality specifications. At this time typically the laser chamber is replaced with a chamber with new electrodes. A replacement chamber costs several thousand dollars and replacement requires a temporary shutdown of integrated circuit production.

Most electric discharge lasers used for integrated circuit lithography utilize brass as the electrode material. Many other materials have been tested in efforts to discover better electrode material, but to the best of Applicant's knowledge none have been proven to be better than brass taking into consideration all costs including cost of laser manufacture and cost of operation. However, recent tests by Applicants' indicate that a high strength copper material containing submicron clumps of $Al_2O_3$ sold under the trademark GLID-COP® and available from OMG Americas with offices in Research Triangle Park, N.C. Many excellent electrode materials are not compatible with the extremely reactive fluorine gas in these chambers.

Sputtered Metal Ions—Important Part of Discharge

Figure 1:
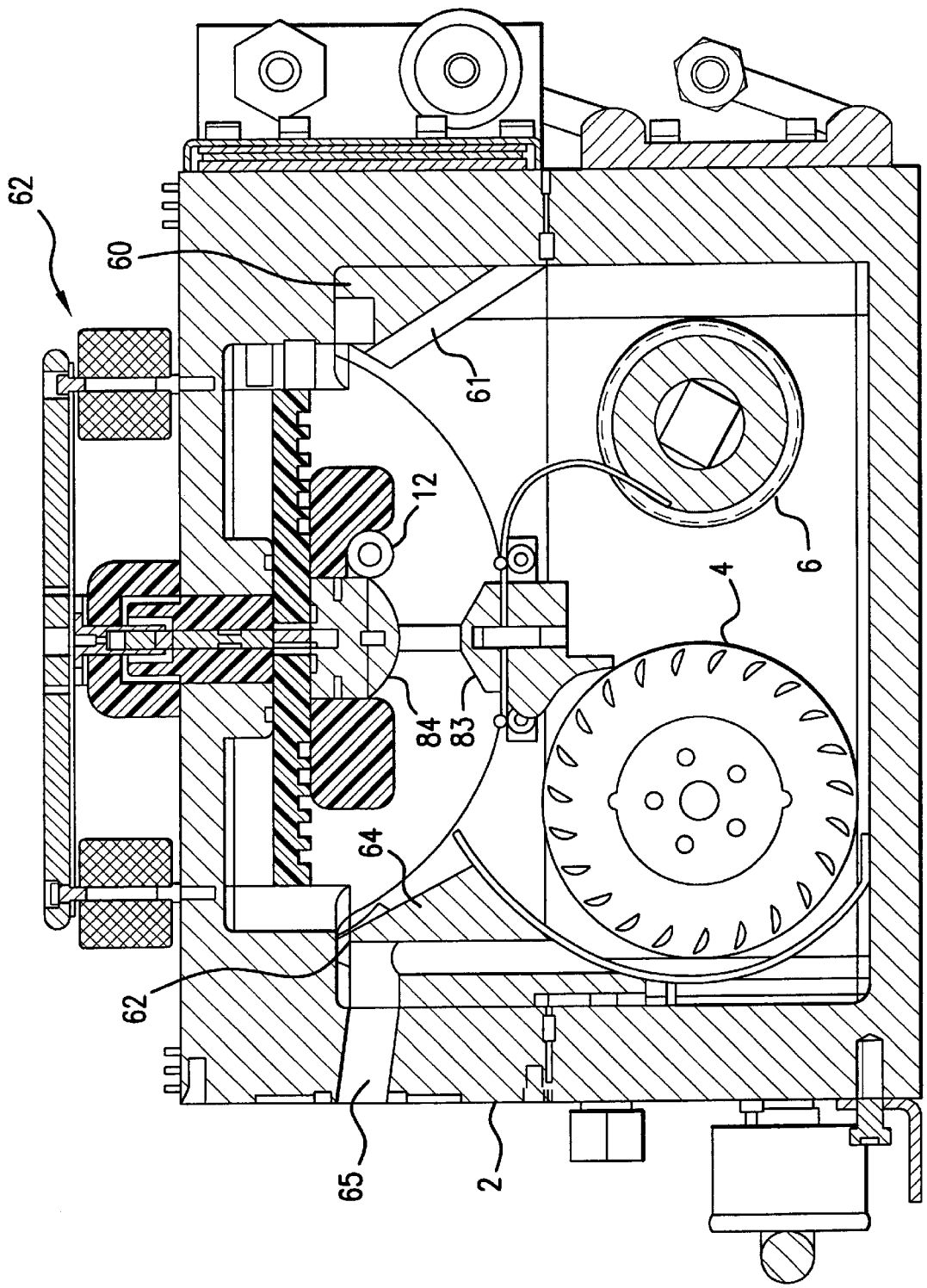
FIG. 1 shows a cross section of a chamber of a prior-art gas discharge laser.
Figure 2:
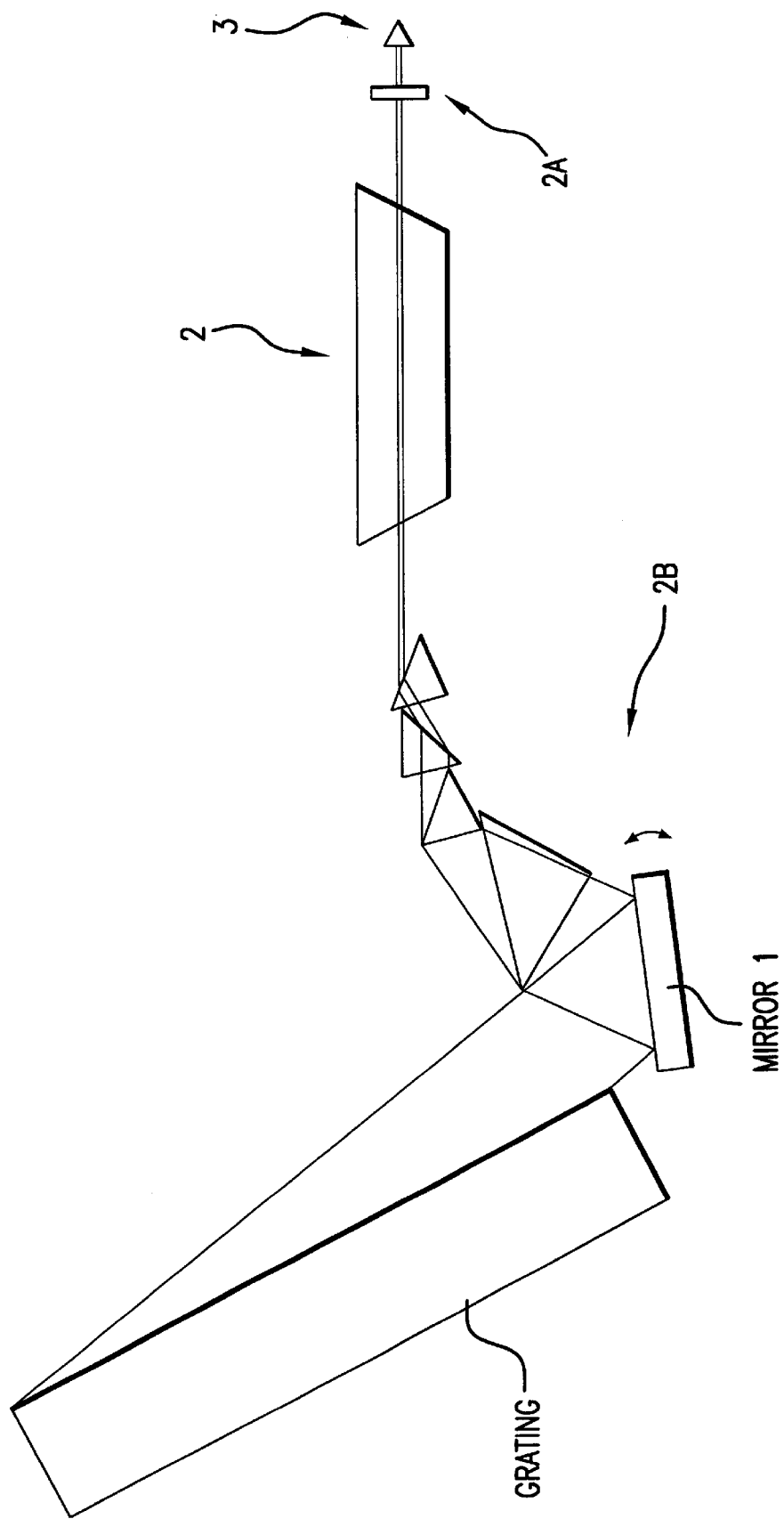
FIG. 2 shows other features of the prior art laser.

In order to create a good laser active media, a uniform discharge plasma must be created between the electrodes. Initially the gas in the gap between the electrodes is preionized with preionizer 12 shown in FIG. 1. As the voltage builds up on the electrodes a substantial portion of the plasma, in the regions close to the cathode is produced by ion sputtering of the electrode material. Metal atoms sputtered from the electrodes are mostly in vapor form and a substantial portion of the metal atoms are ionized and help form a positive ion cathode "fall" region immediately adjacent to the surface of the cathode creating an extremely large electric field which may contribute to the flow of electrons from the cathode and also accelerates electrons leaving the cathode. This process applies first to cathode 84 during the first portion of each pulse. However, because the polarity of the electrodes switch about half-way through the pulse, as shown in FIG. 4B, this effect also occurs at anode 83 which at that time functions as a cathode (i.e., the negative electrode). Both during and after the pulse the metal ions may be attracted back to the electrodes depending on the rapidly changing electric field conditions, but many combine with fluorine and/or are blown away by the circulating laser gas. Applicants have estimated the erosion loss at the anode at about 3 grams per billion pulses or about $3\times10^{-9}$ grams per pulse which corresponds to about $2.8\times10^{13}$ atoms per pulse. Since there are about 1500 mm² of discharge surface on the anode, the loss is about $1.2\times10^{10}$ atoms per mm² per pulse. Since each atomic layer of the brass electrodes contains about $3\times10^{13}$ atoms per mm², an atomic layer is lost from the anode with about 2,500 pulses (a little more than one second at a 2,000 Hz pulse rate). After 10 billion pulses about 4.4 million atomic layers are lost corresponding to a reduction of about 0.5 mm in the vertical position of the discharge surface of the electrode. In prior art electrodes of the type shown in FIG. 1, this reduction is accompanied by a widening of the discharge region on the surface of the electrodes, especially the anode, and a widening, displacement or splitting of the discharge, and a buildup of fluoride layers on portions of the anode discharge surface. This normally has a substantial adverse effect on the quality of the laser beam produced by the laser.

Issues

There are five important issues to deal with in developing a better electrode for electric discharge lithography lasers using fluorine containing laser gas:

1) electrode erosion seriously affects beam quality,
2) electrode erosion currently limits laser chamber life,
3) anode erosion is about four times cathode erosion,
4) fluoride layer buildup on the anode is a problem, and
5) maintaining good gas flow conditions in the discharge gap is very important.

The various embodiments of the present invention described herein deal with these issues. The electrodes satisfy the following criteria:

1) the electrodes comprise an erosion surface which erodes slowly over several billion laser pulses with the erosion not substantially affecting beam quality,
2) the erosion surfaces resists fluoride insulation buildup on discharge regions, and
3) the electrodes are designed to provide improved gas flow to permit repetition rates of 1,000 Hz to 6,000 Hz or greater without substantial turbulence in the discharge region.

First Preferred Embodiment

Figure 5:
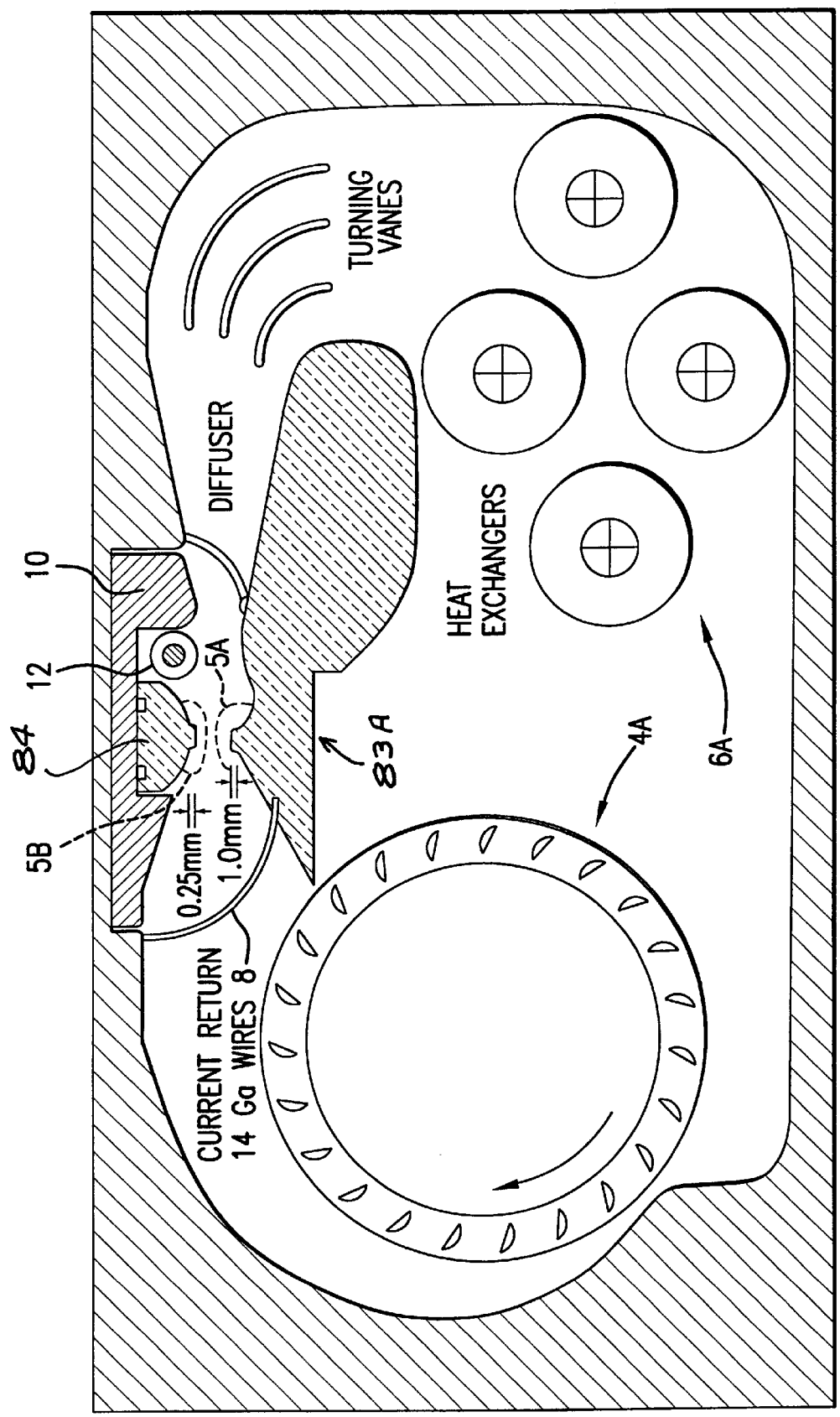
FIGS. 5, 5A and 5B show features of a preferred embodiment of the present invention.
Figure 5A:
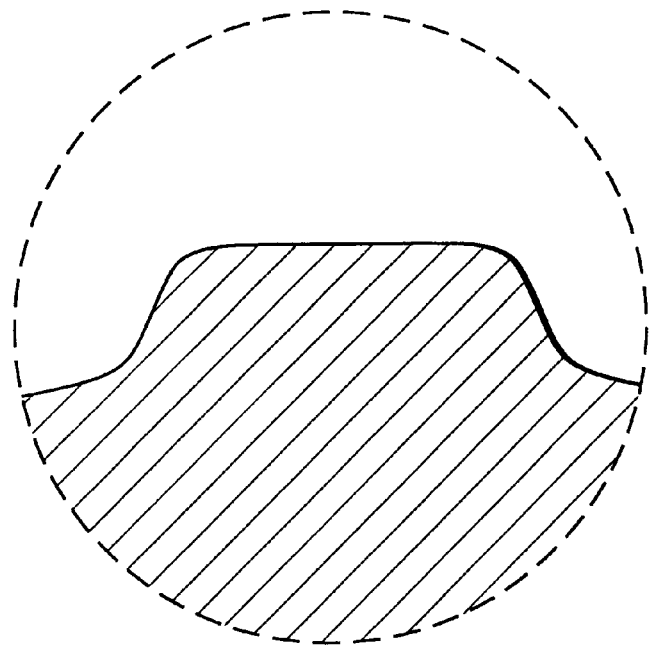
Figure 5B:
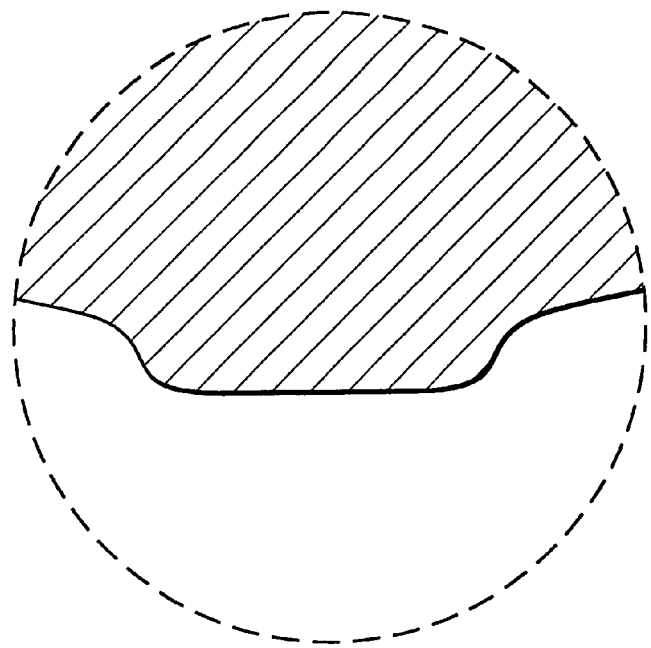

A first preferred embodiment of the present invention is shown in FIG. 5 which shows a cross section of a KrF excimer laser chamber designed for operation at pulse rates up to 4,000 Hz or greater. This repetition rate requires gas circulation between the electrodes of at least several m/s so that the volume of gas in the discharge gap is swept from the discharge gap between pulses. Typical gas speeds between the electrodes might be 25 m/s for 2,000 Hz operation. At 1,000 Hz the minimum speed would be about 5 m/second or greater. As shown in FIG. 5 a large anode-anode support structure is provided with an erosion surface, which will gradually erode during chamber life without substantially changing the pulse shape. This anode-anode support structure in combination with the specially shaped upper chamber surface provides an aerodynamic flow path for the laser gas passing through the discharge region.

The anode-anode support structure is enlarged to serve the functions of an anode, a flow shaper and a portion of the current return. In this embodiment a bulge section is provided on the discharge surface. The bulge section is about 3.0 mm wide near the top and becomes gradually wider lower down so that about 1 mm below the top the bulge is about 4.0 mm wide. On the cathode the bulge portion is similar, about 3.0 mm wide at the bottom and about 3.25 mm wide at about 0.25 mm above the bottom.

Downstream of the discharge region the anode-anode support structure along with the upper inside surface of the chamber provides a generally expanding diffuser region permitting gas pressure recovery and avoiding substantial gas flow turbulence. Preferably a cone angle of about 7 to 15 degrees is provided. Also shown further downstream are three turning vanes to direct the flow downward toward four water-cooled finned heat exchanger elements 6A. The gas is circulated with tangential 8-inch fan blade 4A driven by a 4.5 hp motor (not shown). In this embodiment current return from anode 83A is provided by a whalebone shaped current return array of 14 gauge aluminum wires 8 spaced at 2-inch centers along the length of the anode. Main insulator 10 provides insulation of cathode 84 from the chamber wall. A single downstream preionizer is shown at 12. This embodiment includes four finned water-cooled heat exchanger elements 6A each being similar to the one heat exchanger 6 shown in FIG. 1.

Figure 6:
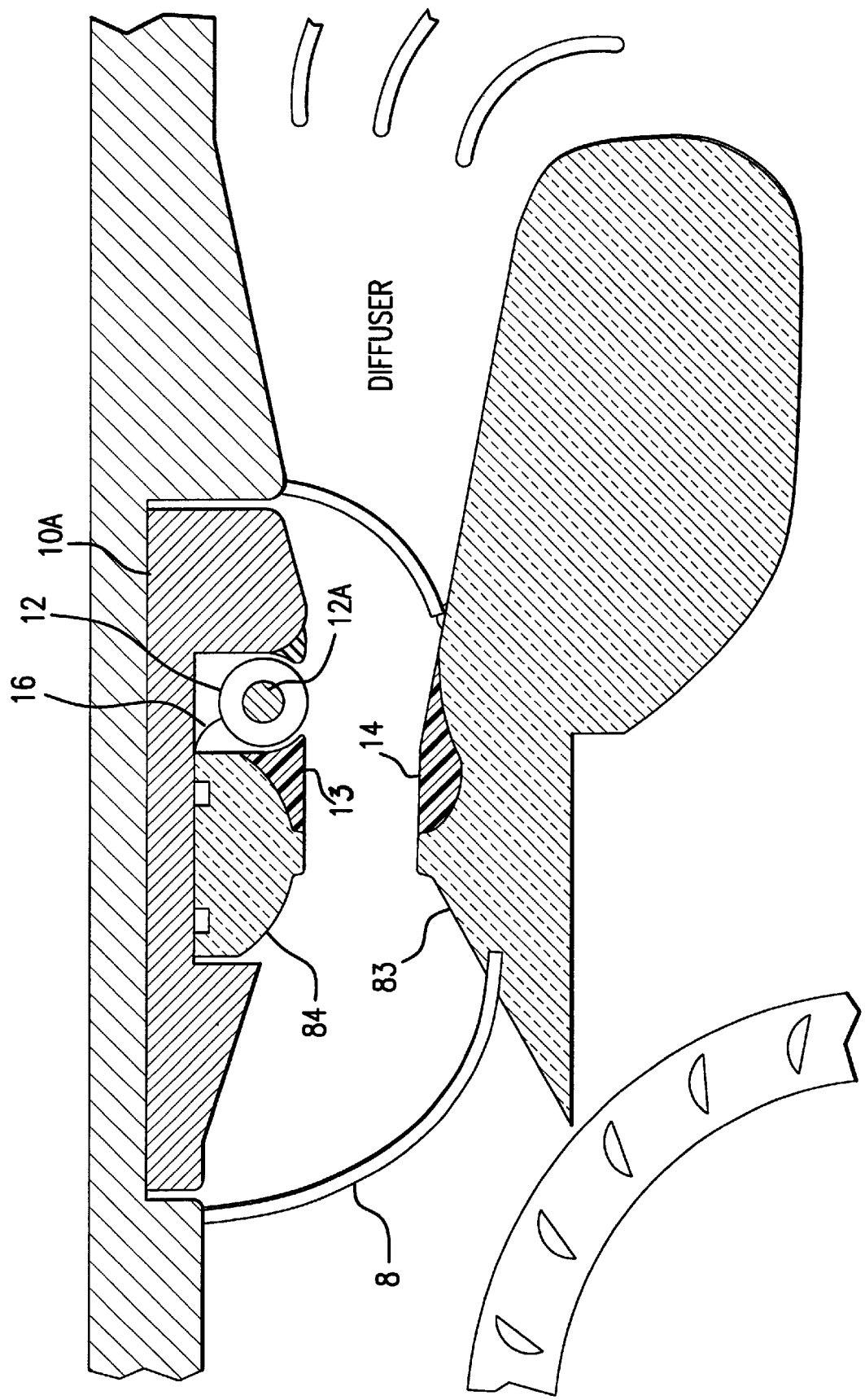
FIG. 6 shows a modification of the FIG. 5 embodiment.

FIG. 6 shows a modified version of the embodiment shown in FIG. 5 in which main insulator 10 has been modified as insulator 10A and an insulating section 13 has been added to cathode 84 and insulating section 14 has been mounted on anode 83 to further improve downstream gas flow. Flexible metal plate 16 provides contact along a line on the surface of preionizer rod 12 in order to create a preionizing discharge along the surface of the rod due to the high voltage potential between metal plate 16 and ground rod 12A which is positioned along the center line of preionizer tube 12.

Other Preferred Embodiments

Insulating Spacers

Figure 7B:
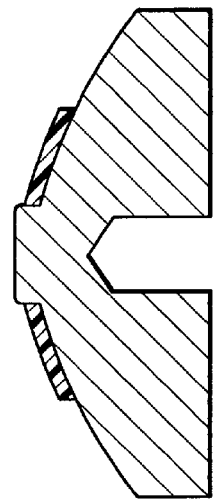
FIGS. 7A, 7B, 7C and 7D show embodiments of the present invention utilizing electrical insulation to define discharge surfaces.
Figure 7D:
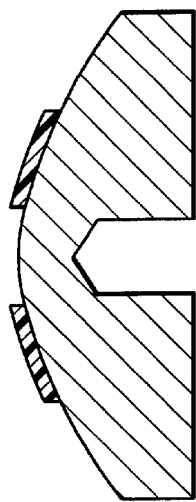
Figure 7A:
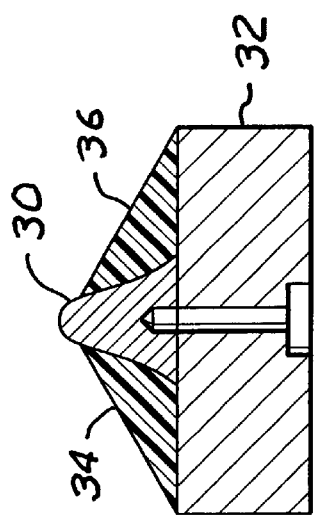
Figure 7C:
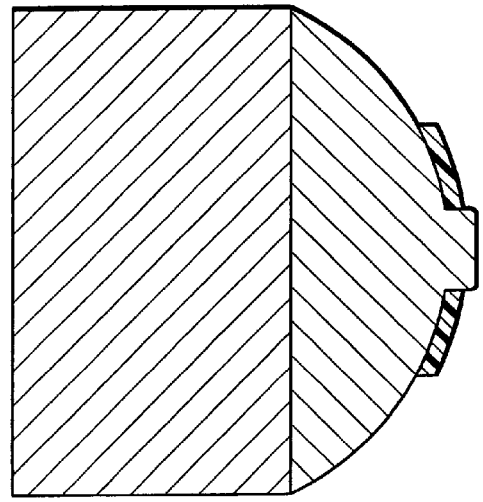

FIG. 7A shows an alternate embodiment in which an erodable electrode 30 is mounted on an electrode support bar 32. In this embodiment spacers 34 and 36 are mounted on support bar 32 to reduce turbulence in the gas flow between the electrodes. FIGS. 7B and 7C show electrodes in which a thin (approximately 0.5 mm insulating spacers have been deposited on both the cathode and anode using a technique such as plasma spray. In this case the insulating layers are about ½ as thick as the height of the erodable bulge portions of the electrodes. This design assures the discharge surface is confined between the insulation-covered regions of the electrode surface. In FIG. 7D the insulating layers are provided to limit the discharge footprint but without a bulge region.

Flow-Through Electrode

Figure 8:
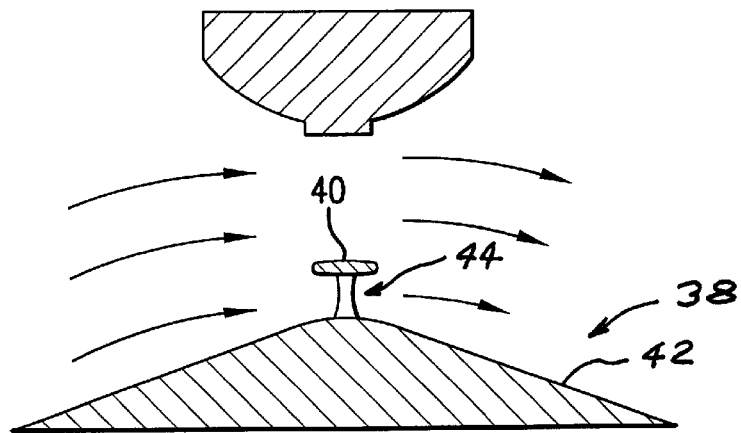
FIG. 8 shows a flow-through anode.

FIG. 8 shows an embodiment in which as anode structure 38 is machined out of brass to create a three-element structure consisting of erodable element 40 which has a generally rectangular cross section as shown in FIG. 8 with dimensions of about 3½ mm, 1 mm and 700 mm and with rounded edges. Element 40 is suspended about 3 mm above electrode base 42 on tiny pilings 44 which are approximately cylindrically shaped with diameters of about 1 mm and are space along the length of the electrode at about 2 cm intervals. This permits a portion of the flowing gas to flow under erodable element 40 to provide improved flow and increased cooling of the discharge region of the electrode. In this embodiment the erodable element of the cathode is not suspended but it could also be fabricated in the manner shown for the anode.

Trenched Electrodes

Figure 9A:
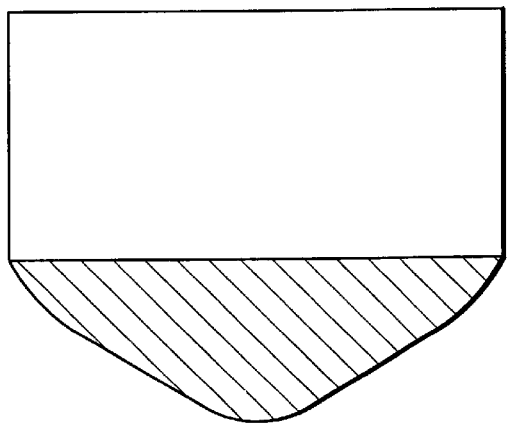
FIGS. 9A, 9B and 9C show trench-type electrode designs.
Figure 9B:
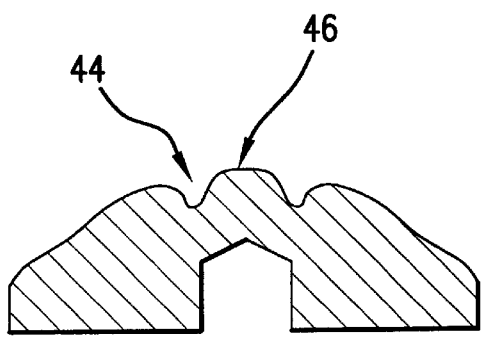
Figure 9C:
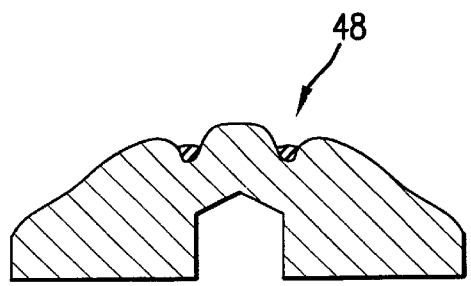

FIGS. 9A and 9B show two electrodes with the 9B electrode having trenches 44 at the edge of the discharge surfaces 46. In FIG. 9C the trenches are filled with an insulator material 48 such as alumina. The trenches provide a boundary limiting the expansion of the discharge region.

Different Electrical Conductance

Figure 10:
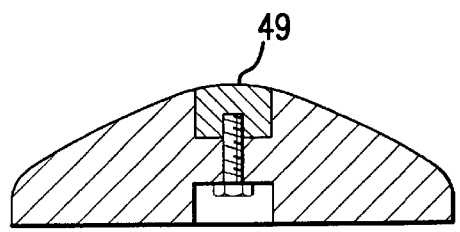
FIG. 10 shows an electrode composed of two different conductor materials.

FIG. 10 shows an embodiment in which the electrode is fabricated with a good conductor material 49 such as brass (where the discharge surface will be) and a lossey conductor such as stainless steel making up the other surfaces of the electrode. With this design the discharge region will be confined to the good conductor even after erosion of more than 0.5 to 1.0 mm.

Sheet Insulator

Figure 11:
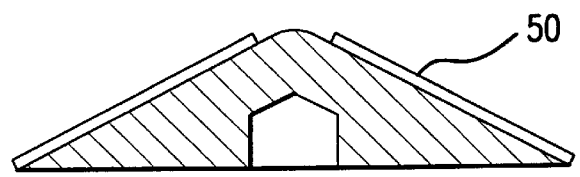
FIG. 11 shows an electrode partially covered with sheet insulation.

FIG. 11 shows an embodiment in which the surfaces of the electrode other than the discharge surface is covered with a 1/16 inch thick sheet of an insulating ceramic 50 such as alumina. The discharge is confined to the uncovered section of the electrode surface to prevent spreading of the beam.

Field Shaping Current Return

Figure 12:
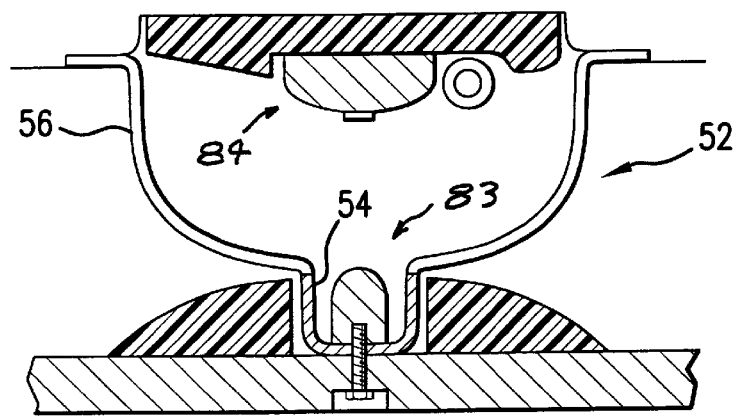
FIG. 12 shows an embodiment using a current return structure for electric field shaping.

FIG. 12 describes an embodiment in which the current return structure 52 is used to help shape the electric field. The portion 54 of the current return on both sides of the erodable portion of the anode structure is a solid aluminum thin plate whereas the portion 56 in the gas flow path are thin aluminum sections spaced at about 2-inch intervals. The portion 56 preferably is formed of plates about 1 mm thick and about 3 mm thick with the wider dimension in the direction of gas flow. Insulating spacers 58 and 60 are provided to guide the flow over erodable portion of the anode structure.

Blade Electrodes

Figure 16:
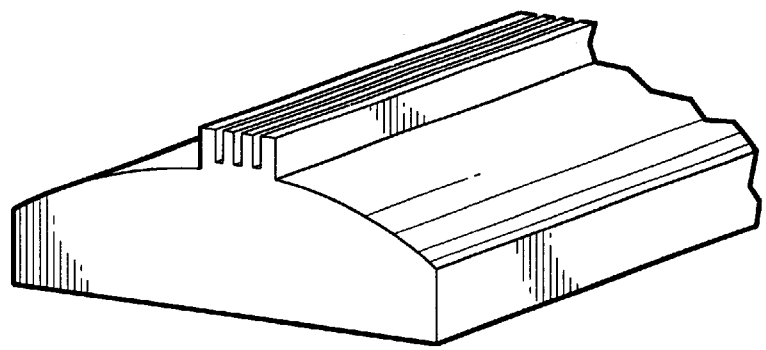
FIGS. 16, 17, 16A and 17A show embodiments using blade electrodes.
Figure 16A:
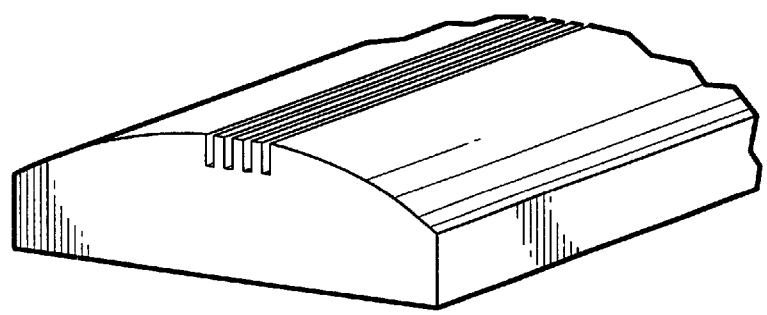
Figure 17:
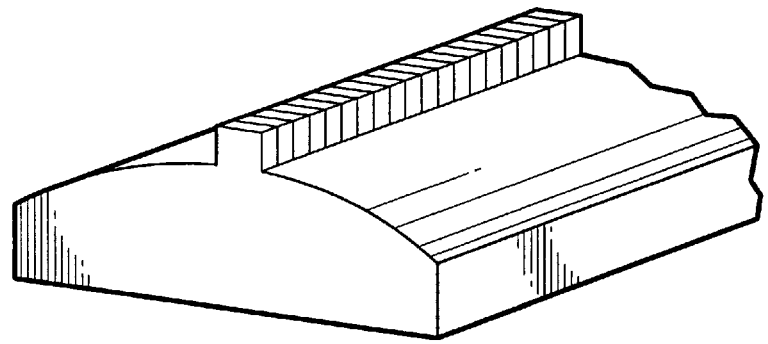
Figure 17A:
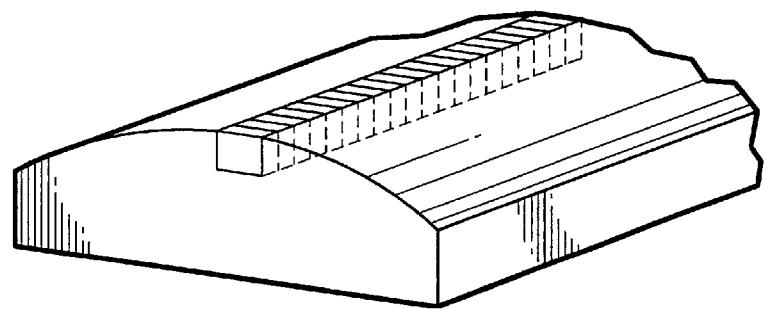

Blade electrodes may be provided to define the discharge surface of the electrodes. These blades produce very high electric fields in the immediate vicinity of the blade tips which will concentrate the discharge on the tips of the blades. The blades may be parallel to the longitudinal axis of the electrodes as shown in FIG. 16 or they may be parallel to the direction of flow as shown in FIG. 17. The blades may extend above the upper surface of the electrode base as shown in FIGS. 16 and 17 or they may be cut below the upper surface of the electrode base as shown in FIGS. 16A and 17A. Or the blades could extend both above and below the surface. In the FIG. 16 and FIG. 16A cases the blades preferably are about 0.01 to 0.020 inches wide and with spaces between them of about 0.005 to 0.010 inch. The array of blades should preferably be about 2 to 5 mm wide. For the FIGS. 17 and 17A type blades the thickness, the spaces between the blades and the thickness of the blade array preferably would be in the same range as described above for the longitudinal blades.

In the FIG. 16 case insulating spacers may be provided as shown in FIG. 7A to improve the flow over the blades. In the case of the FIGS. 16A and 17A embodiments the adjacent surfaces of the electrode base could be covered with insulating material as shown in FIGS. 7B, 7C and 7D to further discourage any significant spreading of the discharge surface.

Dealing With The Metal Fluoride Issue

As stated above, Applicants have learned that metal fluoride layers build up on the anode very gradually over electrode life. The fluoride layer does not build up on the cathode. This material (copper fluoride and zinc fluoride) is an insulator and it interferes with the discharge. The interference, however, is not complete because tiny holes appear in the layer spaced about 0.1 to 1.0 mm apart and current flows into and out of those holes. Furthermore, the fluoride layer substantially reduces further erosion on the surfaces it covers. Apparently, however, the current flow through the holes in a fluoride covered section is not as efficient as the current flow in a non-covered section of the discharge surface. With these discoveries Applicants have developed several solutions to the fluoride issue on the anode.

Insulate the Anode

One solution is to fabricate the anode with an insulating coating but provide a large number of discharge cavities through the insulation layer. Preferably, the holes should be very small, less than 200 microns and spaced apart by about 0.5 mm.

Alternate Electrode Polarity

Another solution to the fluoride on the anode problem is to periodically switch the polarity of the two electrodes. This can easily be accomplished fairly simply by switching the leads out of pulse transformer 56 shown in FIG. 3 and making sure that the bias circuits 120 and 126 are arranged properly. Preferably, the polarity should be switched at intervals no longer than about 100 million pulses so that any anode buildup will be minimal between changes in polarity. With this technique, the small amount of fluoride buildup on an electrode when it is functioning primarily as the anode is burned off when the electrode is functioning as the cathode.

Apply Negative Bias to Anode

Figure 13:
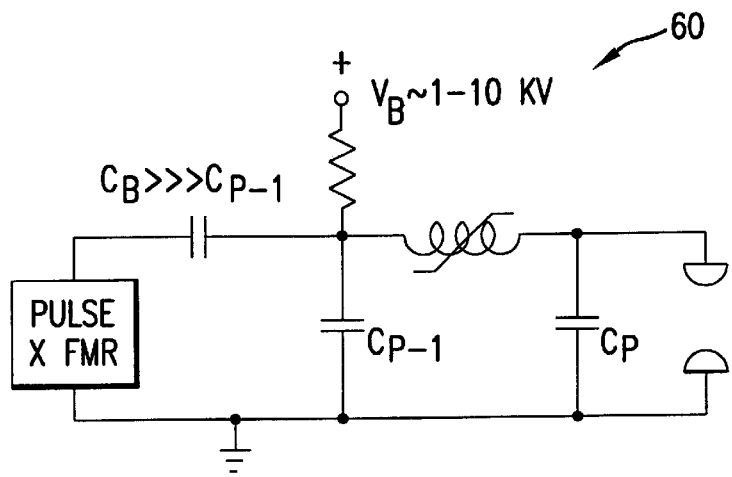
FIG. 13 shows a circuit for applying a negative bias to an anode.
Figure 14:
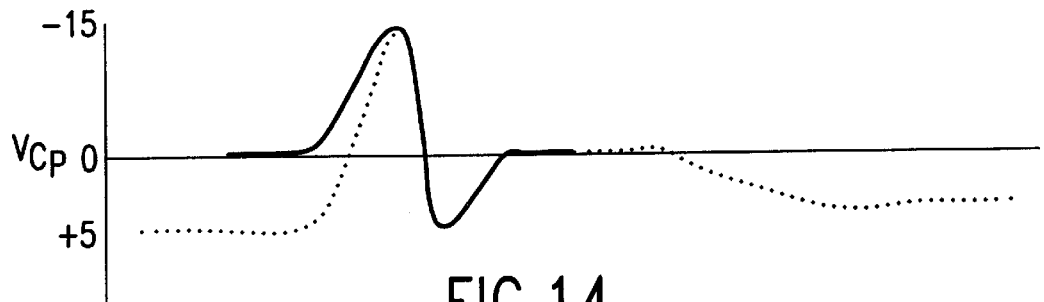
FIG. 14 shows the modification in the electrical pulse shape caused by the bias.

Another solution to the fluoride buildup is to apply a negative bias to the anode so that it is charged negatively at least immediately after the pulse. This will have the effect of applying a repelling force on fluorine ions (which are typically negative ions) after the pulse and will substantially reduce the fluoride buildup on the anode. This negative bias will also help recapture on the anode sputtered positive metal ions immediately after the pulse and therefore contribute to a substantial decrease in the erosion rate of the anode. A simple modification to the circuit shown in FIG. 3 is shown in FIG. 13. A positive bias voltage of between 1 and 10 kv is applied as shown at 60. A blocking capacitor having capacitance much much greater than $C_{p-1}$ prevents the bias voltage from interfering with the discharge pulse and a large resistance in the bias circuit limits the bias current flow during discharge. FIG. 14 shows the effect of the beam circuit on the discharge pulse. The modified pulse is shown as a dotted line.

Periodic Operation without Fluorine

Figure 18:
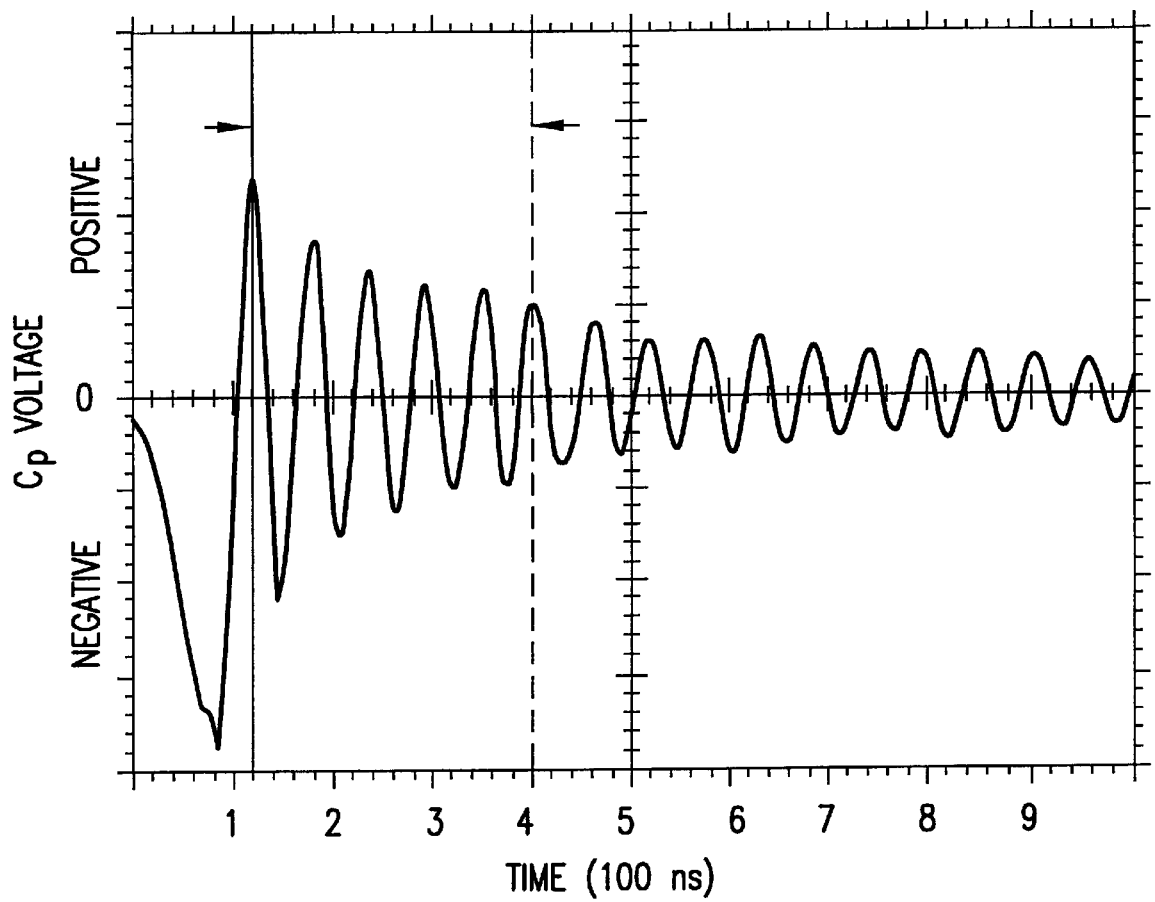
FIG. 18 is an oscilloscope trace of $C_p$ with a fluorine free laser chamber gas.

Another potential method of reducing the fluoride layer buildup is to operate the laser for short periods without fluorine. Applicants have conducted experiments which show that operating the laser without fluorine (i.e., only neon with small percentages of Kr or Ar) provides well conditioned electrode discharge surfaces and reduces the subsequent erosion rate. During operation the laser gas is exchanged periodically (about once each 3 or 4 days). Operation for a few minutes without $F_2$ could normally be accomplished without substantial interference with factory operation. Without fluorine the discharge rings back and forth between the electrodes for many cycles with both electrodes alternatingly functioning as cathodes as shown by the oscilloscope trace of $C_p$ in FIG. 18. This can be compared with the $C_p$ trace shown in FIG. 4B with $F_2$ present. This operation should burn off the fluoride layers that may have built up on the anode since the previous gas replacement.

Secondary Electrode Field

Figure 15:
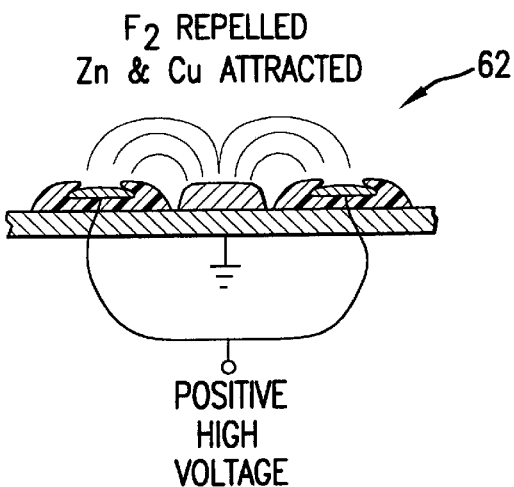
FIG. 15 shows a schematic for applying an external electric field to an electrode to repel $F_2$ and attract metal ions.

Another approach to solve the fluoride buildup problem and to reduce erosion is to establish a secondary electric field which will induce a negative ion flow away from the electrode and induce a positive ion flow toward the electrode at least during a short period immediately following the pulse. This can be accomplished by locating one or more electrodes near the anode discharge surface but outside the discharge region and charging the one or more electrodes to a positive value relative to the anode in order to create an electric field which will repel negative fluorine ions from the anode and attract positive metal ions. Such a circuit is shown in FIG. 15. A positive high voltage such as +5000 V is applied to partially insulated electrodes on both sides of the anode which is at ground potential. An approximate representation of electric field lines are shown at 62 in FIG. 15. This circuit could be kept "on" continuously or it could be turned on for short intervals to over-lap or follow quickly the regular pulse.

Quickly Replaceable Electrode Elements

Figure 19:
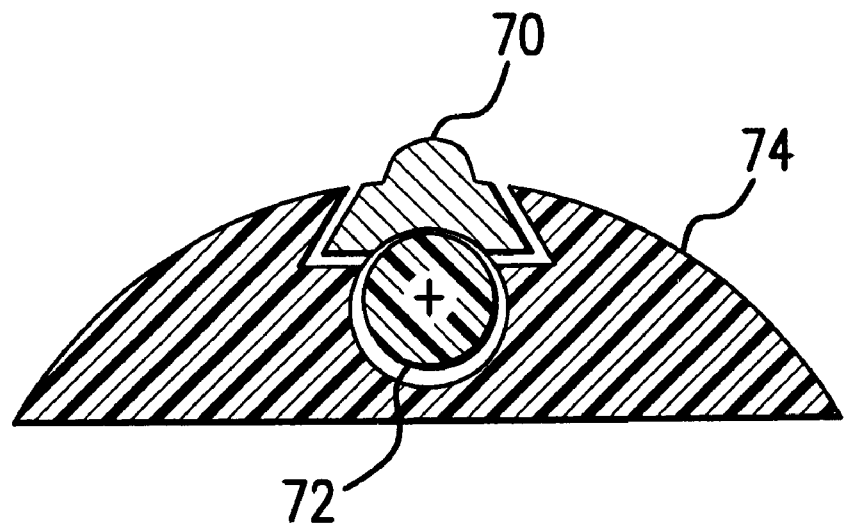
FIG. 19 is a drawing showing a replaceable erodable section.

Another solution to the eroding electrode problem is a quickly replaceable electrode element such as that shown at 70 in FIG. 19. In this embodiment, cam 72 with an off center axis holds replaceable electrode element 70 in place in electrode support 74. Replaceable electrode can be replaced periodically by removing the windows from the laser chamber. Care should be taken in the choice of materials for this embodiment to avoid them welding together during operation.

Position Adjustable Electrode Elements

Figure 20:
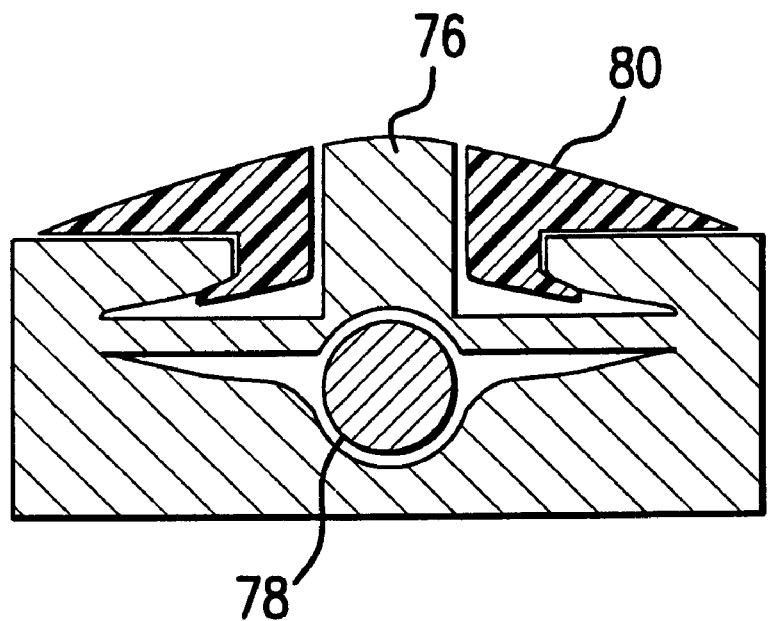
FIG. 20 is a drawing showing a position adjustable erodable section.

FIG. 20 shows a technique for increasing the height of the erodable element 76 periodically as it erodes. Oval shaped cam 78 is rotated utilizing a socket (not shown) at the end of the cam in order to raise erodable element 76 to keep the top of element 76 slightly above the top surface of insulators 80. This can be done periodically with a remote adjustment from outside the chamber or by removing the chamber window.

While the invention has been described above with specificity in terms of preferred embodiments, the reader should understand and recognize that many changes and alterations could be made without deviating from the spirit of the invention. The principals of this invention could be applied to many other gas discharge lasers other than KrF lasers such as, for example, ArF lasers, $F_2$ laser. The bias circuit does not have to be a DC. Therefore, the scope of the invention should be determined by the appended claims and their legal equivalents.

We claim:

1. A gas discharge laser comprising:
   A) a laser chamber containing a laser gas,
   B) two elongated electrodes disposed within said laser chamber, at least one of said electrodes being an erodable electrode means disposed within said laser chamber for supporting electric discharges, said erodable electrode means having an erodable section and an electrode support, wherein said electric discharges define a discharge shape and produce limited erosion on each discharge gradually over at least eight billion pulses to an end-of-life shape without causing a substantial change in the discharge shape,
   C) a pulse power system providing electrical pulses of at least two Joules to said electrodes at rates in excess of 1,000 Hz to produce said electric discharges,
   D) a blower system for circulating said laser gas between said two electrodes at a velocity in excess of 5 m per second,
   E) a heat exchanger having sufficient capacity to remove heat from said laser gas produced by said blower system and said discharge and,
   F) a gas flow guiding means to guide gas flow past said erodable electrode means without creating significant turbulence in said gas either when the electrodes are new or when the electrodes are eroded to their end-of-life shape.

2. A laser as in claim 1, wherein one of said erodable electrode means is as an anode and a flow shaper at least partially defining a gradually expanding diffuser region permitting gas pressure recovery and avoiding substantial flow turbulence downstream of said discharge region.

3. A laser as in claim 2 wherein said gradually expanding diffuser region defines a cone angle of about 7 to 15 degrees.

4. A laser as in claim 2 wherein said erodable electrode means comprise an insulating section to further improve gas flow downstream of said discharge region.

5. A laser as in claim 1 wherein said erodable electrode means further comprises at least one insulating spacer mounted adjacent to said erodable section of said electrode element and configured to reduce gas turbulence in the discharge region.

6. A laser as in claim 1 wherein said erodable electrode means defines a discharge surface and insulated surfaces on two sides of said discharge surface.

7. A laser as in claim 6 wherein said insulated surfaces comprise insulating layers of alumina.

8. A laser as in claim 6 wherein said insulating layer is comprised of a metal fluoride.

9. A laser as in claim 1 wherein said erodable electrode means is connected to its electrode support by tiny pilings permitting laser gas to flow between said erodable section and said electrode support.

10. A laser as in claim 1 wherein at least one of said erodable electrode means define a discharge surface and comprises trenches running longitudinal along two sides of said discharge surface.

11. A laser as in claim 10 wherein said trenches are at least partially filled with insulator material.

12. A laser as in claim 1 wherein said insulator material is chosen from a group consisting of alumina and metal fluorides.

13. A laser as in claim 1 wherein said erodable electrode means is comprised of a first material having high electrical conductance defining a high conductance and a relatively low electrical conductance material having electrical conductance of less than 70 percent of the high conductance, said material having high electrical conductance defining a discharge surface.

14. A laser as in claim 13 wherein said material having low electrical conductance is stainless steel.

15. A laser as in claim 1 wherein said erodable electrode means defines a discharge surface and comprising insulating sheet disposed on two sides of said discharge surface.

16. A laser as in claim 15 wherein said insulating sheet is alumina having a thickness of about 1/16 inch.

17. A laser as in claim 1 and further comprising a current return structure to shape the discharge to a desired shape and further comprising insulating spacers to guide the gas flow through and beyond the discharge region.

18. A laser as in claim 1 wherein one of said two electrode functions primarily as a cathode, and the other electrode functions primarily as an anode, and further comprising a bias circuit means for applying a negative potential to said anode relative to said cathode at least during time periods following each electrical pulse.

19. A laser as in claim 1 wherein one of said two electrode functions primarily as a cathode, and the other electrode functions primarily as an anode, and further comprising a bias circuit means, including at least one conductor positioned near said anode, for applying a negative potential to said anode relative to said second conductor at least during time periods following each electrical pulse.

20. A laser as in claim 1 wherein one of said two electrode functions primarily as a cathode, and the other electrode functions primarily as an anode, and further comprising a bias circuit means, including at least one conductor configuration positioned near said anode and said cathode, for applying a negative potential to said anode and to said cathode relative to said conductor configuration.

21. A laser as in claim 20 wherein said conductor configuration comprises one or two elongated conductors located approximately equidistance from said anode and said cathode.

22. A laser as in claim 20 wherein said conductor configuration comprises one or two elongated conductors positioned near said anode and one or two elongated conductors positioned near said cathode.

23. A laser as in claim 1 wherein said erodable section is comprised of an array of blades.

24. A laser as in claim 23 wherein said laser gas circulating between said electrodes define a gas flow direction and said array of blades are disposed parallel to said gas flow direction.

25. A laser as in claim 23 wherein said laser gas circulating between said electrodes define a gas flow direction and said array of blades are disposed perpendicular to said gas flow direction.

26. A laser as in claim 1 wherein said erodable section of said erodable electrode means is quickly replaceable through windows in said laser chamber.

27. A laser as in claim 1 wherein of said erodable section of said erodable electrode means is position adjustable relative to said electrode support.

28. A laser as in claim 1 wherein said erodable section is covered with an insulating layer having a plurality of discharge cavities through the insulating layer.

29. A laser as in claim 28 wherein most of said cavities have a major dimension of less than 200 microns.

30. A laser as in claim 28 wherein said cavities are spaced apart by about 0.5 mm and have a major dimension of less than 200 microns.

31. A process for operating a gas discharge laser having erodable elongated electrodes and a pulse power system defining a normal electrode polarity comprising periodically reversing the normal electrode polarity.

* * * * *

UNITED STATES PATENT AND TRADEMARK OFFICE
CERTIFICATE OF CORRECTION

PATENT NO. : 6,466,602 B1 Page 1 of 1
APPLICATION NO. : 09/590961
DATED : October 15, 2002
INVENTOR(S) : Fleurov et al.

It is certified that error appears in the above-identified patent and that said Letters Patent is hereby corrected as shown below:

Column 9:
Line 59, after "electrode means is" and before "an anode" delete "as".

Signed and Sealed this

Second Day of January, 2007

JON W. DUDAS
*Director of the United States Patent and Trademark Office*